United States Patent
Melanson

(10) Patent No.: US 6,340,940 B1
(45) Date of Patent: Jan. 22, 2002

(54) DIGITAL TO ANALOG CONVERSION CIRCUITS AND METHODS UTILIZING SINGLE-BIT DELTA-SIGMA MODULATORS AND MULTIPLE-BIT DIGITAL TO ANALOG CONVERTERS

(75) Inventor: John Laurence Melanson, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/618,370

(22) Filed: Jul. 18, 2000

(51) Int. Cl.[7] .................................................. H03M 3/01
(52) U.S. Cl. ........................................................ 341/143
(58) Field of Search .......................................... 341/143

(56) References Cited

U.S. PATENT DOCUMENTS

| 5,585,802 A | * 12/1996 | Cabler et al. ................. 341/143 |
| 6,130,633 A | * 10/2000 | Lee et al. ..................... 341/143 |
| 6,011,501 A1 | * 1/2001 | Gong et al. .................. 341/150 |

* cited by examiner

Primary Examiner—Howard L. Williams
(74) Attorney, Agent, or Firm—James J. Murphy; Winstead Sechrest & Minick

(57) ABSTRACT

A digital to analog converter re-codes a stream of 1-bit digital data into a stream of multiple-bit data with a gain greater than one. The resulting stream of multiple-bit data is then converted into analog form in a multiple-bit digital to analog converter. By applying a gain of greater than one to the 1-digital data stream the higher modulation index available in the multiple-bit can be exploited.

23 Claims, 3 Drawing Sheets

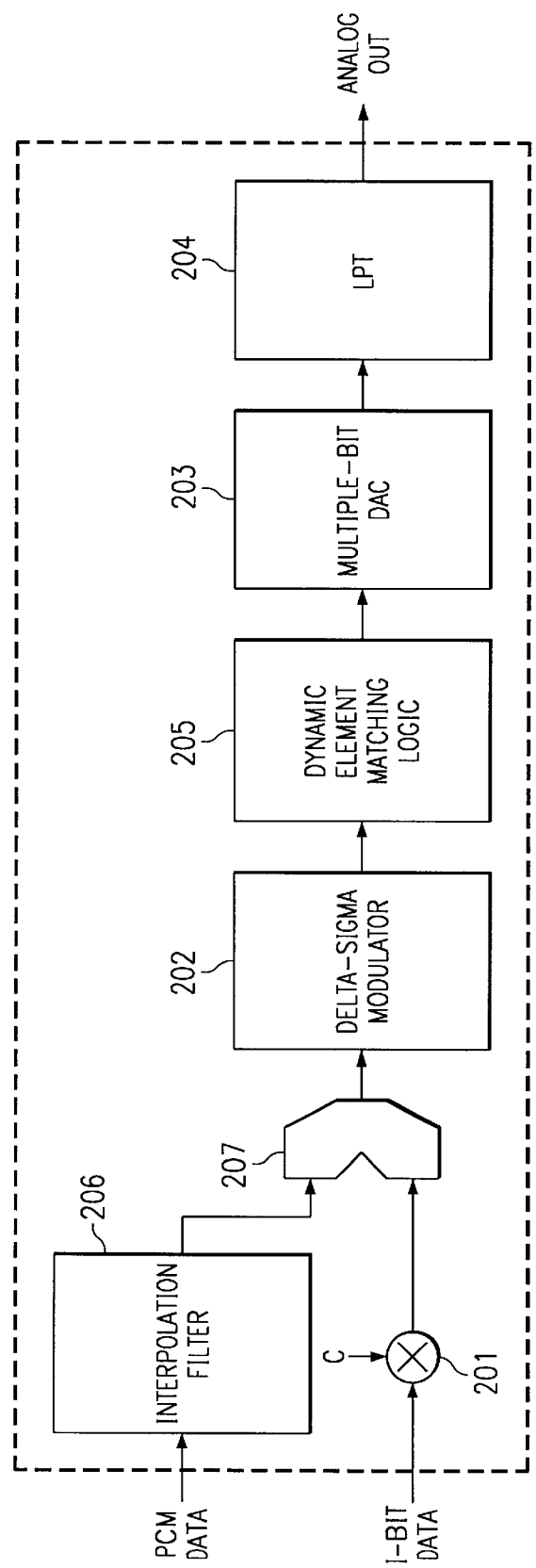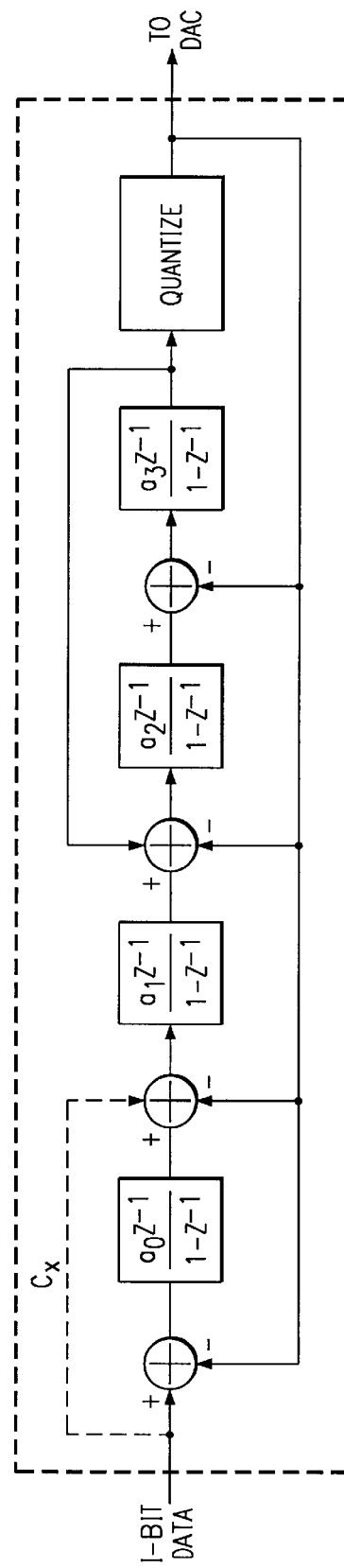

DIGITAL TO ANALOG CONVERSION CIRCUITS AND METHODS UTILIZING SINGLE-BIT DELTA-SIGMA MODULATORS AND MULTIPLE-BIT DIGITAL TO ANALOG CONVERTERS

BACKGROUND OF THE INVENTION

1. Field of the Invention

The present invention relates in general to digital signal processing and in particular to circuits, systems and methods for digital to analog digital conversion.

2. Description of the Related Art

To date, most audio formats have used PCM encoding or an encoding that is decoded into a PCM format. As an example, a compact disk is recorded with a 16-bit format, and a 44100 Hz sample rate. Newer audio formats use up to 24 bits, and up to 192 kHz sample rates. In these cases the DAC receives PCM data and passes the data through an interpolation filter to increase the sample rate. A delta-sigma modulator then reduces the number of bits representing each sample, for example from 24-bit samples to 1-bit samples (this is called a single bit modulator) or to 4-bit samples (a multi-bit modulator). Modulator performance is typically specified in terms of its Modulation Index or MI, which is the ratio of the maximum allowable signal peak modulator input to the mathematical maximal modulator input (equivalent to the signal peak of the feedback signal). For example, if the MI is 0.5 and the modulator has a single-bit bipolar output range, the maximum allowable input produces an output that is 75%+1 and 25%−1 for an average of 0.5. The delta-sigma modulator creates significant quantization noise; however, the delta-sigma modulator has the ability to shift this self-generated noise out of the signal band.

If a multi bit modulator is used, the 4-bit data from the delta-sigma modulator is next thermometer encoded to represent 16 levels. The thermometer encoded data is passed through dynamic element matching logic implementing an algorithm for shaping the noise to account for digital to analog converter (DAC) element mismatch.

The DAC, which ultimately converts the digital data to analog for eventual presentation to the listener as audio, is often a switched-capacitor circuit that also provides filtering, although continuous time circuits may be more appropriate.

One advantage of multi-bit systems is that a higher modulation index can be used, meaning that the output signals can be of a greater level. The greater signal level directly improves the signal to noise level.

The newer Sony/Philips 1-bit recording system ("Super Audio CD" or "SADC") stores data from an analog modulator onto the given digital storage media in a 1-bit format. As a result, techniques for converting data in the 1-bit digital format to analog must be developed. This is a non-trivial problem since such factors as filtering out of band noise, gain control through the modulator, and hardware minimization must be considered. Moreover, it is usually a requirement that a dynamic range of −120 dB in the audio band be achieved.

The conversion of one bit data normally does not gain the level advantages that the multi-bit modulator has. One such technique is disclosed in co-pending and co-assigned U.S. Pat. No. 6,011,501 entitled "CIRCUITS, SYSTEMS AND METHODS FOR PROCESSING DATA IN A ONE-BIT FORMAT" by Gong, et al. Granted Jan. 4, 2000.

Given the potential for wide acceptance of the Sony/Philips 1-bit audio format, and the continuous demand for improved sound quality, circuits, systems and methods for digital to analog conversion of 1-bit audio data are required.

SUMMARY OF THE INVENTION

According to one embodiment the principles of the present invention, a digital to analog converter is disclosed which includes re-coding circuitry with a is gain of greater than one for re-coding a received stream of 1-bit digital data into a stream of multiple-bit data. A multiple-bit digital to analog converter converts the stream of multiple-bit data into analog form.

The advantageous use of a multiple-bit DAC to perform the digital to analog conversion takes advantage of the higher modulation indices typically found with multiple-bit DACs vis-a-vis single bit DACs. Additionally, droop at the signal band edges can be substantially reduced or eliminated. In other words, a 1-bit DAC can be build and operated which has the high MI and constant gain of a multi-bit system. Further, these principles are flexible and can implemented in any one of a number of ways, including through the use of a gain stage in front of the multiple-bit DAC which is either a multiplier or a filter, such as a finite impulse response filter.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A is a diagram of the functional blocks of one channel of a first DAC circuit suitable for use in the DAC subsystem of FIG. 1;

FIG. 3 is a diagram of an exemplary delta-sigma modulator suitable for use in the circuit of FIG. 2A;

DESCRIPTION OF THE PREFERRED EMBODIMENTS

The principles of the present invention and their advantages are best understood by referring to the illustrated embodiment depicted in FIG. 1–5 of the drawings, in which like numbers designate like parts.

Figure 1:
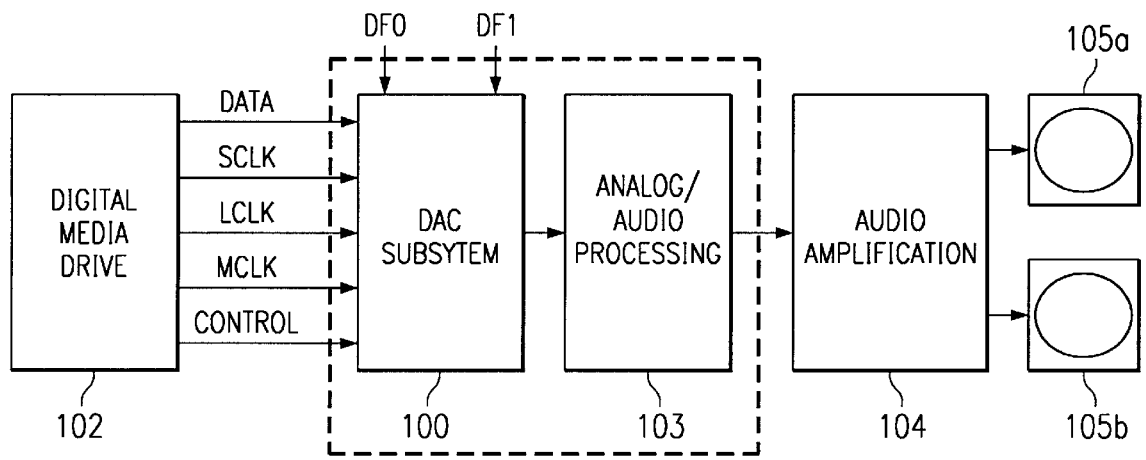
FIG. 1 is a diagram illustrating the major functional blocks of a digital-to-audio converter (DAC) subsystem embodying the principles of the claimed invention.

FIG. 1 is a diagram of a typical system application of 1-bit analog to digital converter (DAC) 100 according to the principles of the present invention. In this example, DAC subsystem 100 forms part of an audio component 101, such as a compact disk (CD) player, digital audio tape (DAT) player or digital video disk (DVD) unit. A digital media drive 102 recovers the digital data, for example 1-bit audio data in the Sony/Philips 1-bit format from the given digital data storage media, and passes those data, along with clocks and control signals, to DAC subsystem 100. The resulting analog (audio) data undergoes further processing in circuit block 103 prior amplification in amplifier block 104. Amplifier block 104 then drives a set of conventional speakers 105, a headset or the like.

Multibit digital audio data is received word-serial through the SDATA pin and serial interface/format selector 101 timed by the sampling clock (SCLK). The left and right channel data are alternately processed in response to the left-right clock (LRCK). This clock is normally at the same rate as the data input rate (i.e., the sampling rate) Control signals DF1 and DF0 allow for the selection of the input format, for example, right or left justified, 20-bit or 24-bit word width, to name a few possibilities. When 1-bit data is being input, the SDATA port receives left channel data and the DF1 port right channel data.

FIG. 2 is a functional block diagram of one channel of a DAC 200 according to the principles of the present invention and suitable for use in DAC subsystem 100. DAC 200 includes a gain stage (multiplier) 201, Delta-Sigma modulator 202, which re-codes the 1-bit data into multiple-bit data, a multiple-bit DAC 203, which converts the multiple-bit data into analog form, and a low pass filter 204. Each of these blocks will be discussed in detail below; however, it is important first to consider the basic inventive concepts behind DAC 200.

One of the significant advantages of multiple-bit DACs is their increased signal-to-noise ratio (SNR) over single-bit DACs. This increase in SNR is primarily due to the higher modulation index (MI) of the multiple-bit circuits. For example, with a 16-level DAC, a MI of over 0.9 is achievable, which results in an SNR improvement of approximately 5 dB relative to a MI of 0.5. On the other hand, the typical single-bit DAC has an MI of 0.5, and a correspondingly lower SNR. (It should be noted that the alternative approach of attempting to improve the SNR by decreasing noise in a switched capacitor device, such as a DAC, more than triples capacitor size, which takes up additional chip area and increases device cost). The one-bit data formats, such as SACD, use a MI of 0.5 as the standard.

Another consideration is gain scaling, which differs between multiple-bit and single-bit DACs. Multiple-bit DACs typically provide higher gain over their single-bit counterparts. Since it is desirable in most audio applications to provide the capability to process either multiple-bit or single-bit audio, some accommodation must currently be made at the system level to account for differences in gain scaling to insure consistent volume control. Gain scaling differences can also be a significant disadvantage in applications other than those related to audio as well.

According to the principles of the present invention illustrated in FIG. 2, the 1-bit data is multiplied by a constant greater than 1 by gain stage (degenerate multiplier) 201. Preferably, the gain is set in the range of 1.6 to 1.9, which results in a MI in the range of 0.8 to 0.95 through modulator 202.

One exemplary embodiment of modulator 202 is shown in FIG. 3, which is a fourth order Delta-Sigma modulator including summers 301a–301b, integrator stages 302a–302b and quantizer 303. (The principles of the present invention are not limited to 4th order devices.) Delta-Sigma modulator 201, whose noise transfer function is generally the high pass response shown in FIG. 2B, re-codes the 1-bit data into multiple-bit data having m number of levels. Modulator 202 also shifts much of the modulation noise from the audio band, generally as shown. The complementary signal transfer function of modulator 201 generally has low pass characteristics, with roll-off above the audio band. This removes much of the modulation noise transmitted with the one bit audio signal.

Frequency response droop can be present in the signal transfer function at the output of LPF 203. Notwithstanding, the present inventive concepts provide for the compensation of this droop by increasing the gain at the passband edge of the modulator. To accomplish this filtering function in the preferred embodiment, the 1-bit input is fed forward to the second stage 302b through gain $C_x$, or even beyond to the third or fourth stages, to compensate for droop at the higher frequency edge of the passband of filter 203. This option is shown by dashed lines in FIG. 3 at 305.

Figure 2B:
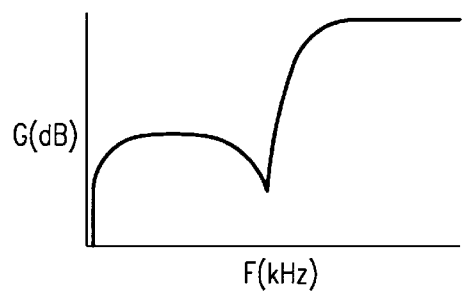
FIG. 2B is a graph illustrating the typical noise transfer function through the ΔΣ modulator of FIG. 2A.
Figure 2C:
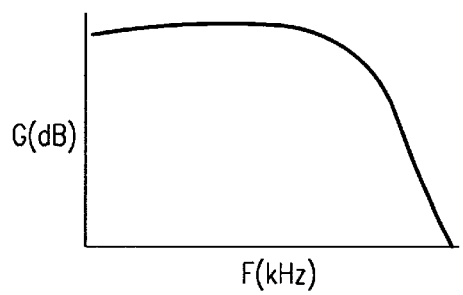
FIG. 2C is a graph illustrating the typical signal transfer function through the low pass filter of FIG. 2A.

The m-level data output from modulator 201 is passed through conventional switched-capacitor multi-bit DAC 202, other conventional (or multiple-bit DAC circuit), as selected by multiplexer 207, and converted into the analog domain. Analog low pass filter 203 filters the analog signal with a signal transfer function generally as shown in FIG. 2C. Dynamic element matching (DEM) logic 205 may be provided at the input of the multi-bit DAC for shaping noise which may result from DAC element mismatch.

Figure 4:
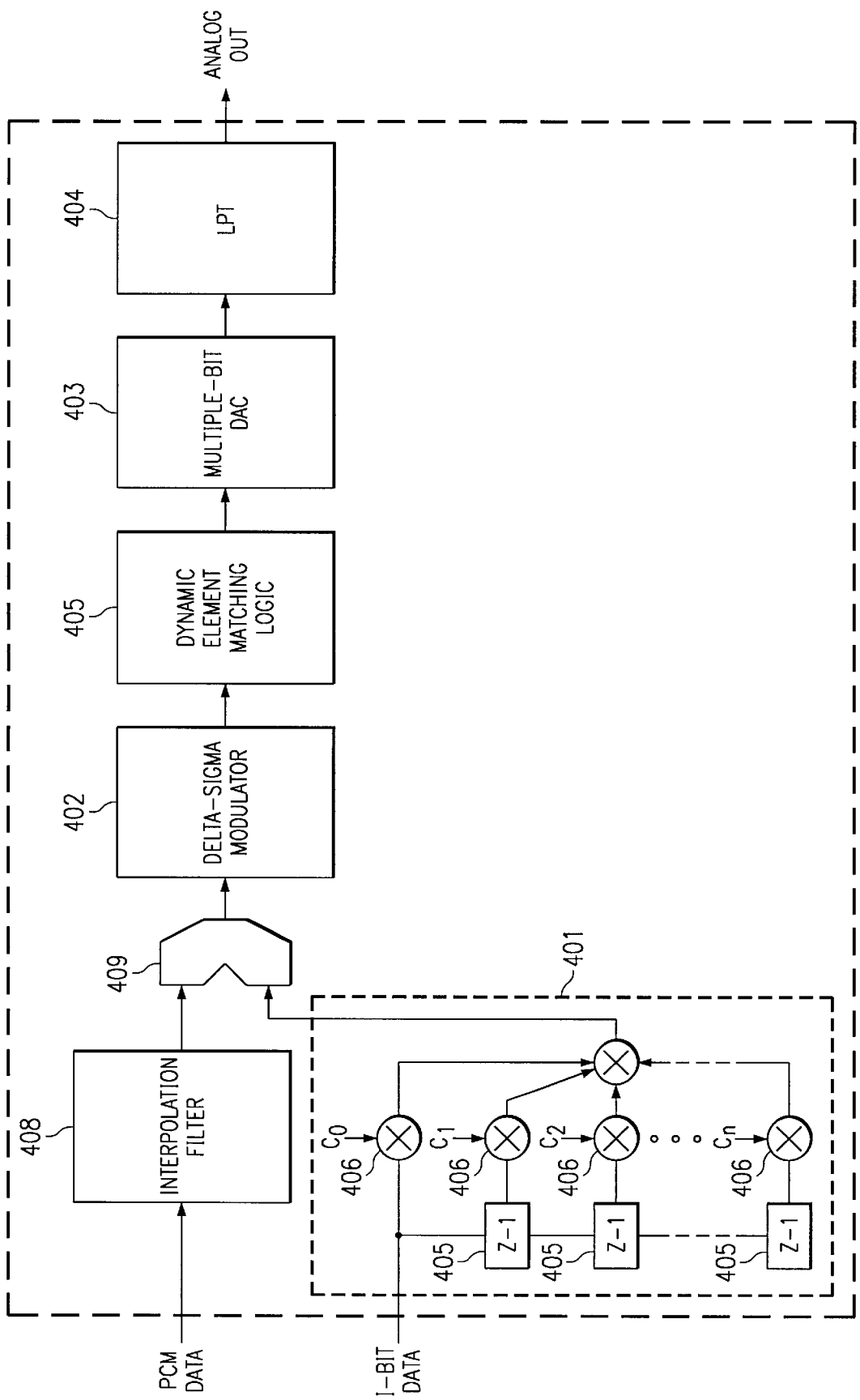
FIG. 4 is a diagram of one channel of a second DAC suitable for use in the DAC subsystem of FIG. 1.

In the preferred embodiment, traditional multiple-bit (PCM) data may also be switched by multiplexer 207 from interpolation filter 206 to delta-sigma modulator 202. Therefore, the gain through gain stage 201 preferably is set to match as closely as possible the gain through interpolation filter 206. Consequently, the analog output signal level is mode independent, and the SNR advantage in both modes are also equivalent FIG. 4 depicts an alternate 1-bit DAC 400 embodying the inventive concepts. Here, the input 1-bit data is passed through a finite impulse response (FIR) filter 401 and then on to Delta-Sigma modulator 402, multiple bit DAC 403 and low pass filter (LPF) 404. Generally, FIR 401 includes a set of delays 405, preferably one-bit, and a set of multipliers 406 for applying the appropriate weighing coefficients $C_n$. Typically between 4 to 32 such taps are used, which can be implemented with gates and adders.

FIR filter 401 is a low pass filter which filters the 1-bit data at a high bit rate and removes high frequency out-of-band noise. Preferably, FIR filter 401 has an in-band gain greater than one and runs at least at the rate of multiple-bit DAC 403 and the quantizer of modulator 403, which may be for example 64 fs, where fs is the sampling frequency. It should be noted that the rate data input into FIR 401 is not necessarily the rate at which the filter operates. For example, 64 fs data could be received at the FIR input and then doubled to 128 fs and filtered.

Figure 5A:
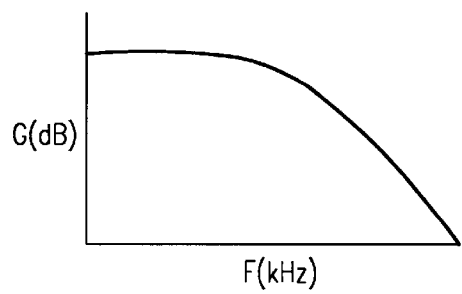
FIG. 5A is a graph depicting a typical signal transfer function through the low pass filter of FIG. 4 without droop compensation.
Figure 5B:
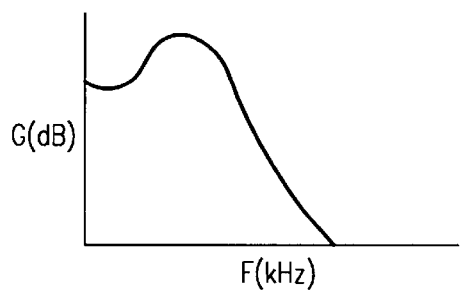
FIG. 5B is a graph depicting a typical signal transfer function through the low pass filter of FIG. 4 with droop compensation.

Advantageously, filter 401 can provide boost at the band edge, as is demonstrated in FIGS. 5A and 5B, which respectively show the output from LPF 404, with and without boosting. Alternately, the above technique of creating boost with feedforward coefficients can be used. In this case, the droop can result both from the FIR filter itself, if identical coefficients are used, or from LPF 404. Identical coefficients, or very simple coefficients, such as ¼, ½, and 1, allow for very simple filter implementation.

It should be recognized however that another type of low pass filter, such as an infinite impulse response (IIR) filter, with an in-band gain greater than one, can be used in place of FIR filter 401, although at the cost of added complexity.

The output from FIR filter 403 is re-coded into the multiple-bit format by delta sigma modulator 402 for conversion by multiple-bit DAC 403.

DAC 403 is also used for converting PCM data received through the multibit PCM path including interpolation filter 408, as switched by multiplexer 409. Preferably, the gain through FIR filter 401 is set to approximate the gain through interpolation filter 408. Again, this feature advantageously allows either a 1-bit or a PCM mode to be selected without significant changes in the analog output signal level.

In either of the example systems discussed above, the multi-bit DAC 202/402 preferably has a noise floor well below that associated with the 1-bit data. Consequently, the re-coding of the 1-bit data to multi-bit data does not significantly impact the total noise floor. Alternatively, dynamic element matching (DEM) logic may be provided at the multi-bit DAC input for implementing noise reduction, as shown in the figures for illustrative purposes.

In sum, the principles of the present invention provide a number of advantages. Among other things, the multi-bit DACs can be used for both single-bit and multi-bit applications without differences in gain scaling. This reduces the required circuitry at the system level normally required to equalize the response between multiple-bit and single-bit processing paths.

Further, the use of a multiple-bit DAC to perform the actual digital to analog conversion takes advantage of the higher modulation indices typically found with multiple-bit DACs vis-a-vis single bit DACs, which in turn leads to improved signal to noise ratios. Additionally, droop at the filter band edges can be substantially reduced or eliminated. In other words, a DAC with one-bit input can be built and operated which has the high MI and constant gain of a multi-bit system Although the present invention and its advantages have been described in detail, it should be understood that various changes, substitutions and alterations can be made herein without departing from the spirit and scope of the invention as defined by the appended claims.

What is claimed is:

1. Digital to analog converter circuitry comprising:
   re-coding circuitry comprising a gain stage with a gain greater than one and a delta-sigma converter including a modulator for re-coding a received stream of 1-bit digital data into a stream of multiple bit data, said gain stage having a gain greater than one; and
   a multiple-bit digital to analog converter for converting said stream of multiple-bit data into analog form.

2. The digital to analog converter circuitry of claim 1 wherein said gain stage comprises a filter with a gain greater than one.

3. The digital to analog converter circuitry of claim 2 herein said filter comprises a finite impulse response filter having an in-band gain greater than one.

4. The digital to analog converter circuitry of claim 3 wherein said finite impulse response filter is configured to compensate for droop at an output of said digital to analog converter circuitry.

5. The digital to analog converter circuitry of claim 2 wherein said stream of 1-bit digital data has a selected bit rate and said filter filters said stream of 1-bit digital data at a rate greater than said selected bit rate.

6. The digital to analog converter circuitry of claim 1 wherein said delta-sigma modulator has a low-pass signal transfer function.

7. The digital to analog converter circuitry of claim 6 wherein said delta-sigma modulator further includes compensation for droop at an output of said digital to analog converter circuitry.

8. The digital to analog converter circuitry of claim 7 wherein said compensation comprises at least one feed forward path.

9. The digital to analog converter circuitry of claim 1 wherein said stream of 1-bit data has a noise floor and said multiple-bit digital to analog converter has a noise floor substantially below said noise floor of said stream of 1-bit data.

10. A digital to analog conversion system comprising:
    a first processing path for processing a stream of 1-bit data samples and having a gain greater than one;
    a second processing path for processing a stream of multiple-bit data samples;
    a delta-sigma modulator for changing a number of bits per sample from a selected one of the streams of 1-bit and multiple-bit data samples from a corresponding one of said first and second processing paths; and
    a multiple-bit digital to analog converter for converting a stream of multiple-bit data output from a selected one of said modulator.

11. The digital to analog conversion system of claim 10 wherein said second path has gain approximating the gain of said first processing path.

12. The digital to analog converter system of claim 10 and further comprising a low pass filter coupled to an output of said multiple-bit digital to analog converter.

13. The digital to analog converter system of claim 10 wherein said multiple-bit converter has a noise floor substantially lower than a noise floor associated with said stream of 1-bit data.

14. The digital to analog converter system of claim 10 wherein a first stage of said 1-bit data path comprises a filter having an in-band gain greater than one.

15. The digital to analog converter system of claim 14 wherein said filter comprises a finite impulse response filter.

16. The digital to analog converter system of claim 14 wherein said filter comprises an infinite impulse response filter.

17. A method for converting 1-bit data into analog data comprising the steps of:
    re-coding the 1-bit data into multiple-bit data in a delta-sigma converter including a modulator and a gain stage with a gain of at least one; and
    converting the multiple-bit data into an analog signal with a multiple-bit digital to analog converter.

18. The method of claim 17 wherein said step of re-coding comprises the substeps of:
    passing the 1-bit data through a gain stage comprising a multiplier stage having a gain of at least one; and
    converting data output from the multiplier into multiple-bit data with a delta-sigma modulator.

19. The method of claim 17 wherein said step of re-coding comprises the substeps of:
    passing the 1-bit data through a gain stage comprising a filter having an in-band gain of at least one; and
    converting the data output from the filter into multiple bit data with a delta-sigma modulator.

20. The method of claim 19 wherein said step of passing the 1-bit data through a filter comprises the step of passing the 1-bit data through a finite impulse response filter.

21. The method of claim 17 wherein said step of converting is performed at a data rate approximately as high as a data rate at which said step of re-coding is performed.

22. The method of claim 17 and further comprising these step of passing the analog signal through a low pass filter.

23. The method of claim 17 wherein the 1-bit data comprises 1-bit audio data.

* * * * *